(12) United States Patent
Sugiura et al.

(10) Patent No.: US 8,379,383 B2
(45) Date of Patent: Feb. 19, 2013

(54) ELECTRONIC APPARATUS

(75) Inventors: Yusuke Sugiura, Ome (JP); Yuichi Koga, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 12/874,057

(22) Filed: Sep. 1, 2010

(65) Prior Publication Data

US 2011/0080710 A1    Apr. 7, 2011

(30) Foreign Application Priority Data

Oct. 2, 2009    (JP) ................................ 2009-230719

(51) Int. Cl.
*H05K 7/20* (2006.01)

(52) U.S. Cl. ......... 361/679.47; 361/679.01; 361/679.26; 361/679.4; 361/679.48; 361/679.55; 165/80.2; 165/80.3; 165/104.21; 165/104.26; 165/185; 248/505; 248/510; 454/184; 345/168

(58) Field of Classification Search ............ 361/679.01, 361/679.02, 679.08, 679.09, 679.26, 679.4, 361/679.46–679.55, 690–697, 717–724, 361/831; 165/80.2–80.5, 104.21–104.34, 165/121–126, 185; 29/831, 890.33, 739, 29/740; 248/118, 118.3, 505, 510, 917, 918; 454/184; 174/16.3, 252; 345/168–172

See application file for complete search history.

(56) References Cited

U.S. PATENT DOCUMENTS

| | | | | |
|---|---|---|---|---|
| 5,313,362 | A | * | 5/1994 | Hatada et al. ................. 361/709 |
| 6,130,388 | A | * | 10/2000 | Nishijima ...................... 200/293 |
| 6,226,175 | B1 | * | 5/2001 | Murayama et al. ...... 361/679.08 |
| 6,407,921 | B1 | | 6/2002 | Nakamura et al. |
| 6,442,025 | B2 | * | 8/2002 | Nakamura et al. ............ 361/695 |
| 6,650,540 | B2 | * | 11/2003 | Ishikawa ....................... 361/695 |
| 6,738,254 | B2 | | 5/2004 | Oogami |
| 6,781,835 | B2 | * | 8/2004 | Hashimoto et al. ........... 361/697 |
| 6,791,835 | B2 | | 9/2004 | Hashimoto et al. |

(Continued)

FOREIGN PATENT DOCUMENTS

| JP | 2000-216575 A | 8/2000 |
|---|---|---|
| JP | 2001-007550 A | 1/2001 |

(Continued)

OTHER PUBLICATIONS

Notice of Reasons for Rejection mailed by Japan Patent Office on Nov. 30, 2010 in the corresponding Japanese patent application No. 2011-154087.

(Continued)

*Primary Examiner* — Michail V Datskovskiy

(74) *Attorney, Agent, or Firm* — Knobbe, Martens, Olson & Bear, LLP

(57) ABSTRACT

According to one embodiment, an electronic apparatus includes a housing, a circuit board in the housing, a cooling unit includes a radiator unit on the circuit board, and a cooling fan connected to the radiator unit and supported outside the circuit board in a floating state, a keyboard on a top wall of the housing, opposed to the circuit board and the cooling fan, a first supporting member disposed between the cooling fan and the keyboard and configured to support the keyboard when a key is depressed, and a second supporting member disposed between the cooling fan and a bottom wall of the housing and configured to support the cooling fan when a key is depressed. At least one of the first and second supporting members is formed of an elastic material.

20 Claims, 5 Drawing Sheets

U.S. PATENT DOCUMENTS

| | | | |
|---|---|---|---|
| 6,917,517 B1 | 7/2005 | Iida | |
| 6,995,975 B2* | 2/2006 | Hamada et al. | 361/679.08 |
| 7,288,733 B2* | 10/2007 | Yamada et al. | 200/5 A |
| 7,312,997 B2* | 12/2007 | Huang et al. | 361/704 |
| 7,405,930 B2* | 7/2008 | Hongo et al. | 361/679.48 |
| 7,649,736 B2* | 1/2010 | Hongo | 361/679.47 |
| 7,660,119 B2* | 2/2010 | Iikubo | 361/697 |
| 7,697,288 B2* | 4/2010 | Okutsu | 361/695 |
| 7,830,663 B2* | 11/2010 | Iikubo | 361/697 |
| 7,952,877 B2* | 5/2011 | Okutsu | 361/700 |
| 8,107,239 B2* | 1/2012 | Fujiwara | 361/695 |
| 8,218,312 B2* | 7/2012 | Watanabe et al. | 361/679.47 |
| 2001/0017764 A1* | 8/2001 | Nakamura et al. | 361/697 |
| 2002/0036888 A1 | 3/2002 | Oogami | |
| 2003/0011986 A1* | 1/2003 | Ariga | 361/687 |
| 2003/0099091 A1 | 5/2003 | Ishikawa | |
| 2003/0198017 A1 | 10/2003 | Hashimoto et al. | |
| 2006/0002981 A1* | 1/2006 | Gwon | 424/427 |
| 2007/0161287 A1 | 7/2007 | Yamauchi | |
| 2011/0080710 A1 | 4/2011 | Sugiura et al. | |

FOREIGN PATENT DOCUMENTS

| | | |
|---|---|---|
| JP | 2002-091623 A | 3/2002 |
| JP | 2003-015776 A | 1/2003 |
| JP | 2003-060365 A | 2/2003 |
| JP | 2003-167648 A | 6/2003 |
| JP | 2003-318337 A | 11/2003 |
| JP | 2006-331226 A | 12/2003 |
| JP | 2005-260252 A | 9/2005 |
| JP | 2007-184206 A | 7/2007 |
| JP | 2007-207944 A | 8/2007 |
| JP | 2009-053265 A | 3/2009 |
| JP | 2011-081437 A | 4/2011 |

OTHER PUBLICATIONS

Notice of Reasons for Rejection mailed by Japan Patent Office on Oct. 18, 2011 in the corresponding Japanese patent application No. 2011-154087.

Decision of Rejection and Decision of Dismissal of Amendment mailed by Japan Patent Office on Jun. 12, 2012 in the corresponding Japanese patent application No. 2011-154087.

* cited by examiner

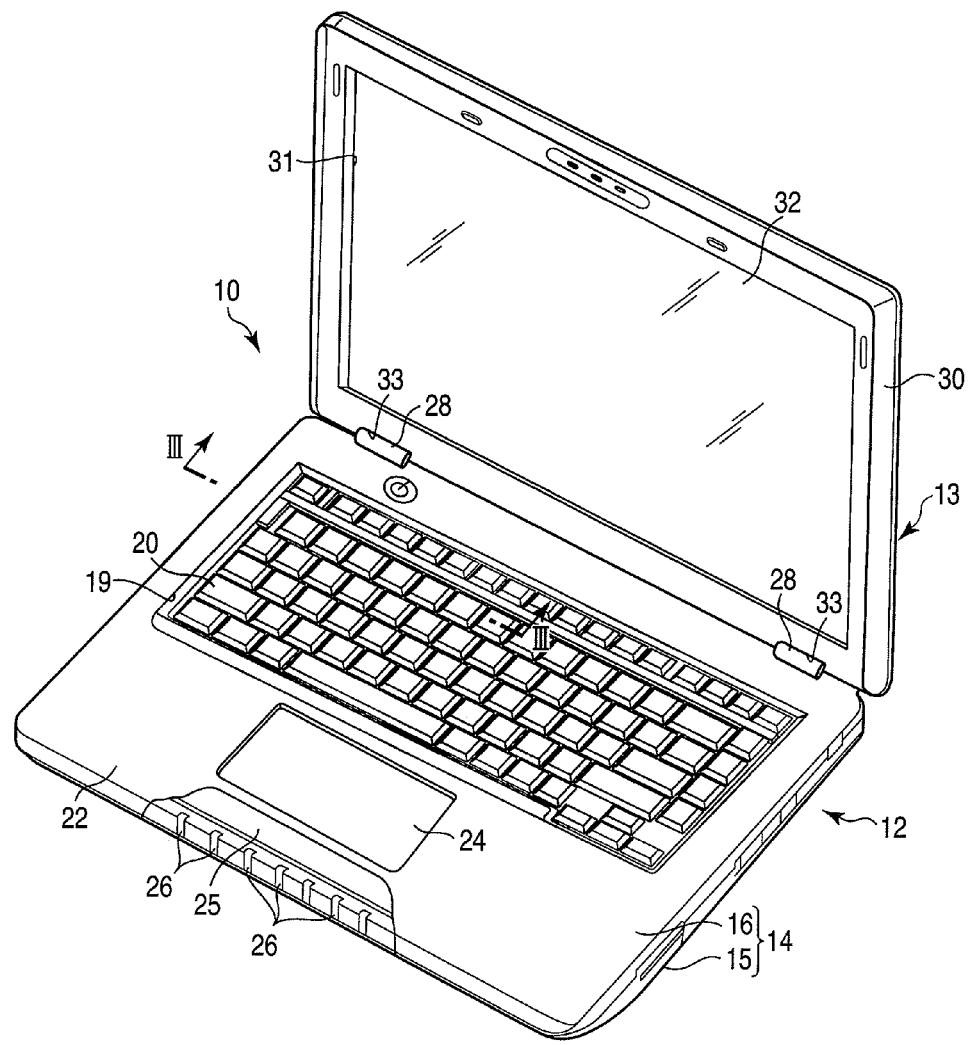
F I G. 1

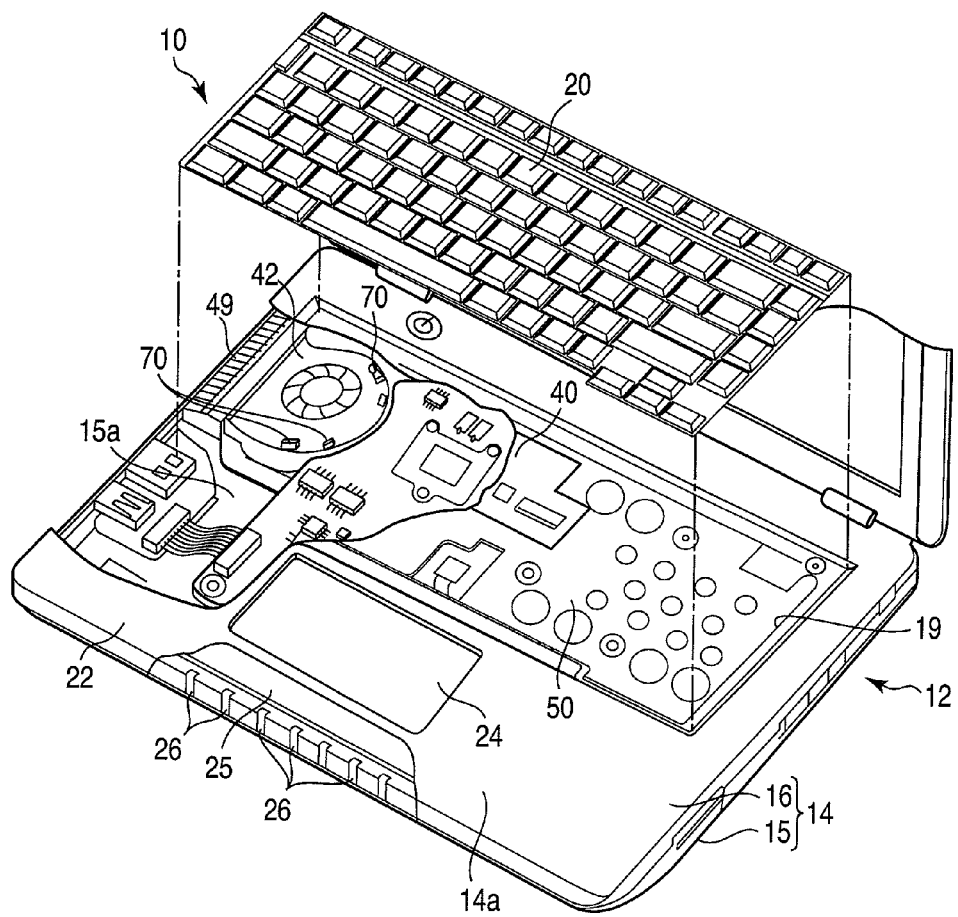
F I G. 2

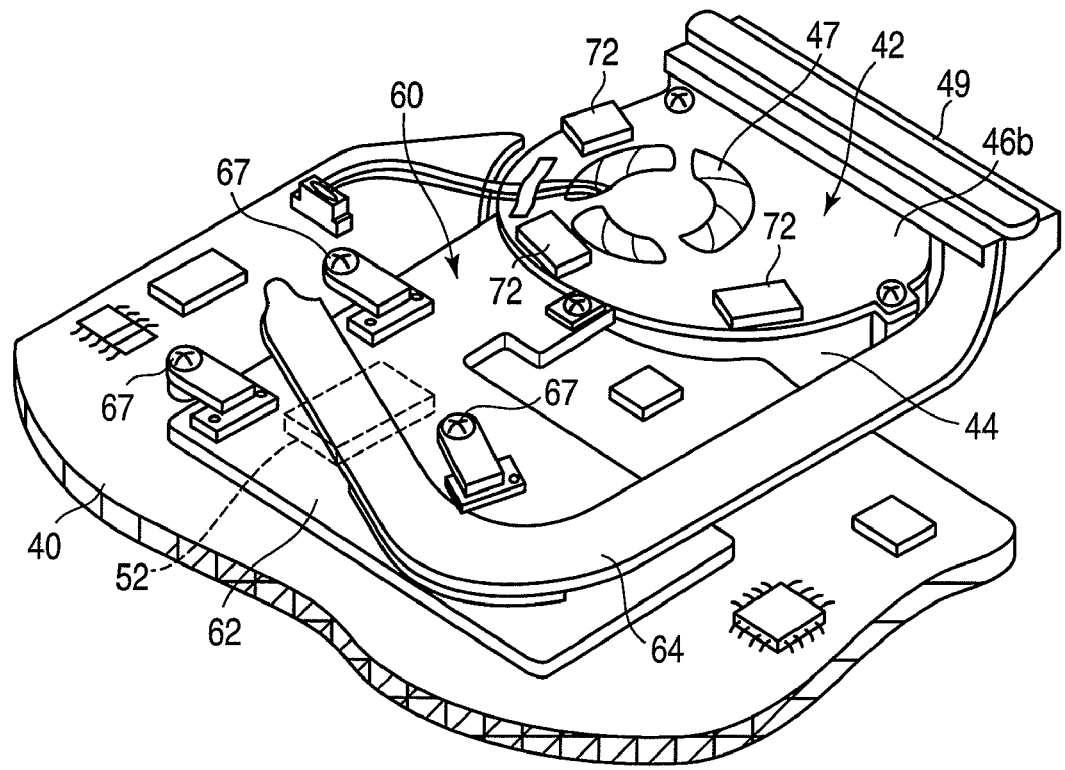
F I G. 5
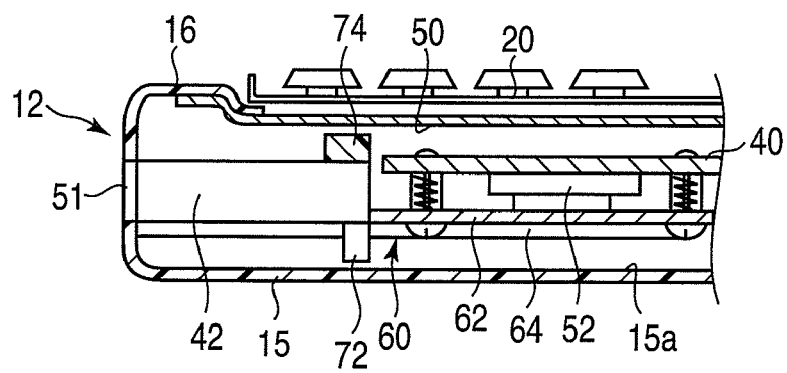
F I G. 6

ELECTRONIC APPARATUS

CROSS-REFERENCE TO RELATED APPLICATIONS

This application is based upon and claims the benefit of priority from Japanese Patent Application No. 2009-230719, filed Oct. 2, 2009; the entire contents of which are incorporated herein by reference.

FIELD

Embodiments described herein relate generally to an electronic apparatus having a keyboard.

BACKGROUND

An electronic apparatus, such as a notebook personal computer, comprises a housing, various electronic components arranged in the housing, a keyboard disposed on the housing, etc. Normally, a printed circuit board, such as a motherboard, is located across a wide span within the housing, and the keyboard is opposed to the upper surface of the circuit board. In order to reduce deflection of the keyboard caused by depression of a key or keys on the keyboard, a plurality of supporting lugs or the like are arranged on the printed circuit board, whereby the keyboard is supported from below (e.g., Jpn. Pat. Appln. KOKAI Publication No. 2003-60365).

A large number of electronic components are mounted on the printed circuit board. Of these electronic components, a CPU and IC chip have been improved in performance, thus entailing an increase in thermal output. To overcome this, personal computers are provided with a cooling unit for cooling the interior of the housing, e.g., the CPU. The cooling unit comprises a radiator unit, including a radiator plate and heat pipe formed of a highly radiative metal, such as aluminum, and a cooling fan for cooling the radiator unit. The radiator unit is mounted on the printed circuit board so as to be in contact with the CPU, while the cooling fan is supported in a floating state outside the circuit board. Further, the keyboard is located overlapping the printed circuit board and cooling fan.

If the keyboard is located above the floating cooling fan, it is difficult to provide keyboard supporting means around the fan. Specifically, if the keyboard supporting means is located above the fan, the fan and radiator unit are greatly moved or twisted every time a key is depressed. Consequently, a load acts on the CPU that contacts the printed circuit board and radiator unit, so that the reliability of the CPU is reduced inevitably. If there is no supporting means around the radiator unit, on the other hand, the keyboard is distorted every time a key is depressed, so that the keytouch feeling is worsened.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is an exemplary perspective view showing a personal computer according to a first embodiment;

FIG. 2 is an exemplary exploded perspective view of the personal computer, showing a keyboard and the internal structure of a housing with its upper cover cutaway;

FIG. 5 is an exemplary perspective view showing the reverse side of the printed circuit board and radiator unit of the personal computer;

FIG. 6 is an exemplary sectional view schematically showing a personal computer according to a second embodiment;

DETAILED DESCRIPTION

Figure 3:
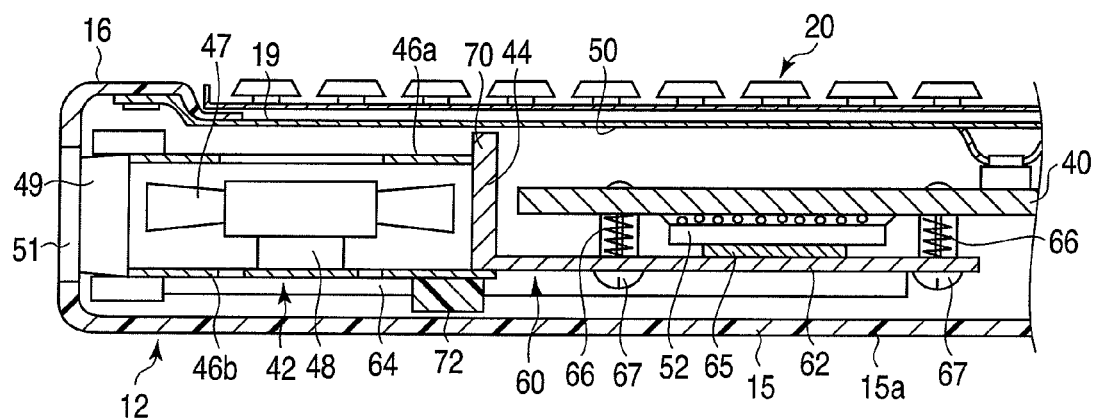
FIG. 3 is an exemplary sectional view of the personal computer taken along line III-III of FIG. 1.

Various embodiments will be described hereinafter with reference to the accompanying drawings. In general, according to one embodiment, an electronic apparatus comprises: a housing comprising a bottom wall and a top wall opposed to the bottom wall; a circuit board in the housing; a cooling unit comprising a radiator unit, which is supported on the circuit board so as to be in contact with an electronic component mounted on the circuit board, and a cooling fan connected to the radiator unit and supported outside the circuit board in a floating state; a keyboard on the top wall, opposed to the circuit board and the cooling fan; a first supporting member disposed between the cooling fan and the keyboard and configured to support the keyboard when a key is depressed; and a second supporting member disposed between the cooling fan and the bottom wall of the housing and configured to support the cooling fan when a key is depressed. At least one of the first and second supporting members is formed of an elastic material.

An electronic apparatus according to a first embodiment will now be described in detail with reference to the accompanying drawings. FIG. 1 shows a personal computer as the electronic apparatus of the first embodiment.

As shown in FIG. 1, a personal computer 10 comprises an apparatus main body 12 and display unit 13 supported on the main body. The main body 12 comprises a housing 14. The housing 14 comprises a base 15, which comprises a rectangular bottom wall, and an upper cover 16 fitted to the base 15 and is in the form of a flat box as a whole. The housing 14 is formed of, for example, a synthetic resin.

A substantially rectangular opening 19 is formed covering the central and rear-half portions of the upper cover 16, and a keyboard 20 (described later) is exposed in the opening. A substantially front-half portion of the cover 16 forms a palmrest 22. An operating area 24 and click switch 25 for operating a pointing device are arranged on the central part of the palmrest 22. A plurality of indicators 26 configured to indicate operating conditions of the personal computer 10 are disposed on the front end portion of the upper cover 16. A pair of lugs 28 are arranged on the rear end portion of the cover 16 so as to be spaced transversely relative to the housing 14.

The display unit 13 comprises a flat, rectangular display housing 30 and a liquid-crystal display panel 32 contained in the display housing. A display window portion 31 is formed on a front wall of the display housing 30. The window portion 31 has a size that covers the greater part of the front wall. A display screen of the display panel 32 is exposed to the outside of the display housing 30 through the window portion 31.

The display housing 30 comprises a pair of connecting recesses 33 on its one end portion. The connecting recesses 33 are spaced apart from each other transversely relative to the display housing 30 and engage the lugs 28 of the housing 14, individually. The display housing 30 are pivotably supported on the housing 14 by the connecting recesses 33 and hinges (not shown) in the lugs 28.

Thus, the display unit 13 is pivotable between closed and open positions. In the closed position, the display unit 13 is brought down to cover the top surface of the housing 14, including the palmrest 22 and keyboard 20, from above. In the open position, the display unit 13 is raised to expose the liquid-crystal display panel 32 and the top surface of the housing. The display unit 13 of the personal computer shown in FIG. 1 is in the open position.

FIG. 2 is an exemplary exploded cutaway perspective view of the personal computer, showing the keyboard and the internal structure of the housing, and FIG. 3 is a sectional view of the personal computer. As shown in FIGS. 2 and 3, a main printed circuit board (motherboard) 40, cooling fan 42, various connectors, secondary cell (not shown), etc., are arranged in the housing 14. The main printed circuit board 40 is secured by screws to a plurality of bosses (not shown), which are set up on a bottom wall 15a of the base 15, and is opposed to the bottom wall of the base in parallel relation with a gap therebetween. Further, the circuit board 40 comprises a region below the keyboard 20 and spreads over about half the area of the base 15. A large number of electronic components, connectors, etc., are mounted on the upper and lower surfaces of the circuit board 40.

As mentioned before, the substantially rectangular opening 19 is formed covering the central and rear-half portions of the upper cover 16, and it is opposed to the main printed circuit board 40 and cooling fan 42. A substantially rectangular supporting metal sheet 50 is provided so as to cover the opening 19. Surrounding the opening 19, the peripheral edge portion of the supporting metal sheet 50 is secured to the inner surface of the upper cover 16. The keyboard 20 is located overlapping the metal sheet 50 within the opening 19 and supported on the metal sheet. A plurality of parts of the supporting metal sheet 50, exclusive of that part which is located above the cooling fan 42, are attached to the main printed circuit board 40 by screws and supported on it.

A CPU 52 with relatively high thermal output is BGA-mounted on the lower surface of the main printed circuit board 40. A cooling unit 60 for cooling the CPU 52 is attached to the circuit board 40. As shown in FIGS. 2 to 5, the cooling unit 60 comprises a radiator plate 62 formed of a highly radiative metal, such as aluminum, the cooling fan cooling fan 42, and a heat pipe 64 that transmits heat from the radiator plate 62 to the air outlet side of the fan 42.

The radiator plate 62, which functions as a radiator unit, has an area sufficiently larger than that of the CPU 52 and contacts the CPU 52 through a thermal transfer sheet 65. The radiator plate 62 is opposed to and supported on the main printed circuit board 40 by fixing screws 67 in a plurality (e.g., three) of spots around the CPU 52. Further, the radiator plate 62 is elastically pressed against the CPU 52 by coil springs 66, which are arranged in positions corresponding to the fixing screws between the main printed circuit board 40 and radiator plate 62. Thus, the radiator plate 62 is in close contact with the CPU 52, so that it can reliably take heat from the CPU. Furthermore, an end portion of the radiator plate 62 extends beyond the peripheral edge of the main printed circuit board 40.

Outside the main printed circuit board 40, the cooling fan 42 is located close to a sidewall of the housing 14. The cooling fan 42 comprises a fan 47 and a fan case that encloses the fan. The fan case comprises an arcuate side frame 44 formed of a metal, such as aluminum, and upper and lower covers 46a and 46b, which are secured to the side frame 44 and opposed to each other with a gap therebetween. The fan 47 and fan motor 48 are provided between the upper and lower covers 46a and 46b, and the fan motor 48 is supported on, for example, the lower cover 46b. An intake 46c is formed in the upper cover 46a. Further, a number of radiator fins 49 are arranged in an air outlet of the fan case.

The cooling fan 42 is located so that the shaft of the fan 47 extends substantially at right angles to the bottom wall 15a of the base 15. The upper cover 46a faces the supporting metal sheet 50 in substantially parallel relation with a gap therebetween, while the lower cover 46b faces the bottom wall 15a in substantially parallel relation with a gap therebetween. The air outlet of the fan case and the radiator fins 49 are opposed to an air outlet 51 formed in the sidewall of the housing 14.

In the present embodiment, the side frame 44 of the cooling fan 42 is, for example, an aluminum structure formed integrally with the radiator plate 62. The side frame 44 is thicker and stronger than the upper and lower covers 46a and 46b. The cooling fan 42 is elastically supported on the main printed circuit board 40 by the radiator plate 62. In this state, the periphery of the cooling fan 42 is in contact with neither the main printed circuit board 40 nor the inner surface of the housing 14. Thus, the cooling fan 42 is supported off its surroundings, that is, in a floating state.

The heat pipe 64, having one end portion secured to the radiator plate 62, is located at least just below the CPU 52. The other end portion of the heat pipe 64 extends outward from the radiator plate 62 and is connected to the radiator fins 49. Heat from the CPU 52 is transmitted to the heat pipe 64 through the radiator plate 62 and further transmitted to the radiator fins 49 by the pipe 64. Then, the radiator fins 49 are cooled by cooling air fed from the cooling fan 42. Thus, the CPU 52 is cooled by the cooling unit 60.

Figure 4:
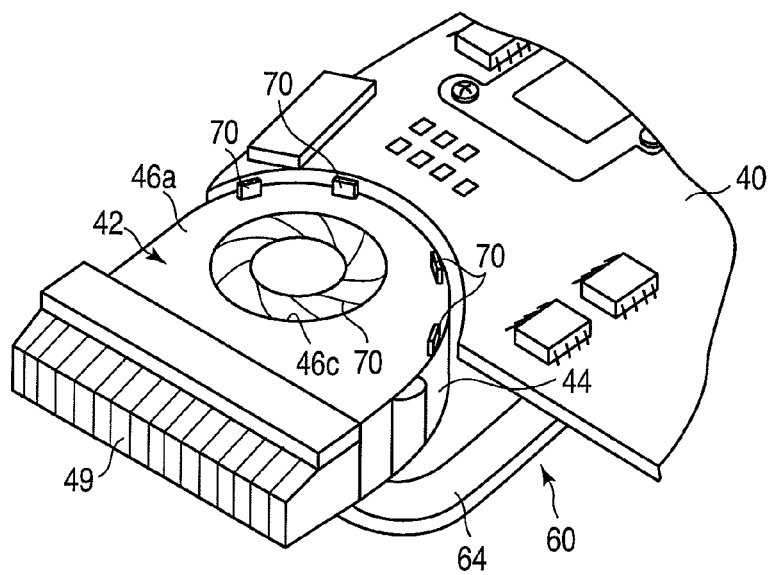
FIG. 4 is an exemplary perspective view showing a printed circuit board and radiator unit of the personal computer.

As shown in FIGS. 3 to 5, first supporting members are provided between the cooling fan 42 and keyboard 20, that is, between the cooling fan and supporting metal sheet 50 in this case, and second supporting members 72 between the cooling fan 42 and bottom wall 15a.

In the present embodiment, the first supporting members comprise a plurality (e.g., four) of ribs 70 that protrude from the cooling fan 42. The ribs 70 are formed integrally with the side frame 44, extend upward from the side frame, and face the supporting metal sheet 50 with small gaps therebetween. In the cooling fan 42, moreover, the ribs 70 are separated from the sidewall of the housing 14 and disposed on the side of the main printed circuit board 40. The ribs 70 are located in positions where the keyboard 20 can be distorted relatively easily when a key is depressed.

Each of the second supporting members 72 (e.g., three members) is a cuboid structure of an elastic material, such as rubber or sponge. The second supporting members 72 are affixed to the lower cover 46b of the cooling fan 42 and face the bottom surface of the base 15 with small gaps therebetween. Further, the second supporting members 72 are provided on the side opposite from the ribs 70, that is, they are separated from the sidewall of the housing 14 and disposed at an end portion on the side of the main printed circuit board 40. The lower cover 46b is relatively weak and may influence the action of blades. Therefore, a supporting structure is strengthened by mounting the second supporting members 72 near the peripheral edge portions of the fan covers, that is, positions that overlap the side frame 44.

If that region of the keyboard 20 which faces the cooling fan 42 is pressed, the keyboard 20 and supporting metal sheet 50 are slightly distorted downward and contact the ribs 70 that form the first supporting members. Further, the cooling fan 42 is displaced slightly downward, whereupon the second supporting members 72 contact the bottom wall 15a of the base 15, thereby supporting the cooling fan 42. Consequently, the keyboard 20 and supporting metal sheet 50 are supported on the base 15 by the ribs 70, side frame 44 of the cooling fan 42, and second supporting members 72, whereby their deflection is suppressed. As the second supporting members 72 contact the base 15, moreover, the cooling fan 42 cannot be greatly displaced. Consequently, the main printed circuit board 40 and CPU 52 can be prevented from being loaded through the radiator plate 62. Since the first supporting members and/or the second supporting members 72 are formed of the elastic material, moreover, vibration from the keyboard 20 can be damped by the elastic material. Thus, transmission of vibration to the radiator plate 62 and thermal transfer sheet 65 can be suppressed.

According to the personal computer constructed in this manner, the keyboard 20 and cooling fan 42 can be supported by the first and second supporting members when a key is depressed. Thus, deflection of the keyboard 20 can be suppressed, so that the keytouch feeling can be improved. Since the first and second supporting members are normally opposed to the inner surface of the housing with gaps therebetween, that is, without contact, moreover, the housing can be supported without failing to maintain the floating support of the cooling fan 42 when a key is depressed. Since the floating radiator unit cannot be greatly moved if a key is depressed, furthermore, an excessive load on the main printed circuit board 40 to which the radiator plate 62 is attached by screws need not be suppressed. Thus, the reliability of the main printed circuit board and CPU can be improved.

The following is a description of another embodiment.

As mentioned before, the first and/or second supporting members are formed of the elastic material, the first supporting members are mounted on the cooling fan or keyboard (or supporting metal sheet), and the second supporting members are mounted on the cooling fan or the bottom wall of the base.

According to a personal computer of a second embodiment shown in FIG. 6, a plurality of first supporting members 74 are formed of an elastic material, such as sponge, and are affixed to an upper cover of a cooling fan 42. These first supporting members 74 are arranged on the peripheral edge portion of a fan cover so as to overlap a side frame and face a supporting metal sheet 50 with small gaps therebetween. On the other hand, second supporting members 72 comprise a plurality of ribs that protrude from the side frame of the cooling fan 42 toward a bottom wall 15a of a base 15. These ribs face the bottom wall 15a with small gaps therebetween.

Figure 7:
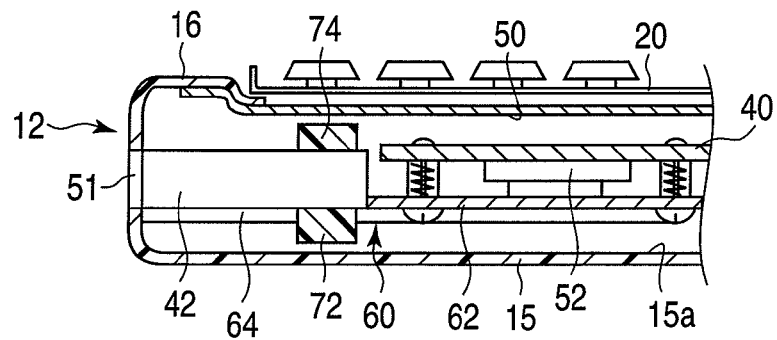
FIG. 7 is an exemplary sectional view schematically showing a personal computer according to a third embodiment.

According to a personal computer of a third embodiment shown in FIG. 7, a plurality of first supporting members 74 are formed of an elastic material, such as sponge, and are affixed to an upper cover of a cooling fan 42. These first supporting members 74 are arranged on the peripheral edge portion of a fan cover so as to overlap a side frame and face a supporting metal sheet 50 with small gaps therebetween. On the other hand, a plurality of second supporting members 72 are formed of an elastic material, such as sponge, and are affixed to a lower cover in positions overlapping the side frame. These second supporting members 72 face a bottom wall 15a with small gaps therebetween.

Figure 8:
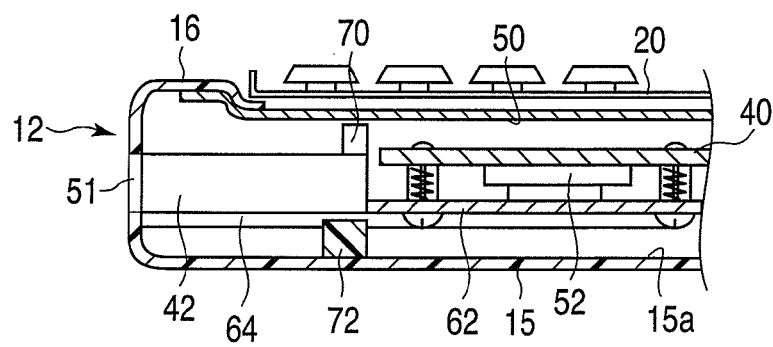
FIG. 8 is an exemplary sectional view schematically showing a personal computer according to a fourth embodiment.

According to a personal computer of a fourth embodiment shown in FIG. 8, first supporting members comprise a plurality of ribs 70 that protrude from a side frame of a cooling fan 42 toward a supporting metal sheet 50. These ribs face the supporting metal sheet 50 with small gaps therebetween. A plurality of second supporting members 72 are formed of an elastic material, such as sponge, and are affixed to a bottom wall 15a of a base 15. These second supporting members 72 face a lower cover with small gaps therebetween, in positions overlapping the side frame of the cooling fan 42.

Figure 9:
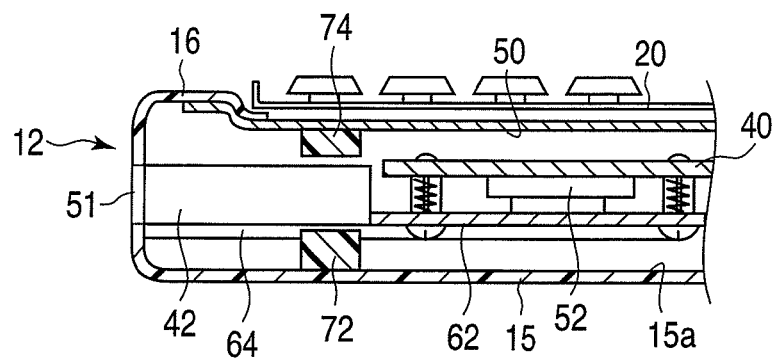
FIG. 9 is an exemplary sectional view schematically showing a personal computer according to a fifth embodiment.

According to a personal computer of a fifth embodiment shown in FIG. 9, a plurality of first supporting members 74 are formed of an elastic material, such as sponge, and are affixed to a supporting metal sheet 50. These first supporting members 74 face an upper cover with small gaps therebetween, in positions overlapping a side frame of a cooling fan 42. A plurality of second supporting members 72 are formed of an elastic material, such as sponge, and are affixed to a bottom wall 15a of a base 15. These second supporting members 72 face a lower cover with small gaps therebetween, in positions overlapping the side frame of the cooling fan 42.

In each of the second to fifth embodiments, other configurations of the personal computer are the same as those of the foregoing first embodiment, so that like reference numbers are used to designate like parts throughout the several views of the drawing, and a detailed description of those parts is omitted. The same functions and effects as those of the first embodiment can also be obtained with the second to fifth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the electronic apparatus is not limited to personal computers but widely applicable to various other types of electronic equipment. The first (second) supporting members need not always be plural, but a single such first (second) supporting member may be provided with the same result.

What is claimed is:

1. An electronic apparatus comprising:
 a housing comprising a bottom wall and a top wall opposite to the bottom wall;
 a circuit board in the housing;
 a cooler comprising a radiator on the circuit board in contact with an electronic component on the circuit board, and a cooling fan connected to the radiator outside the circuit board and supported by the circuit board in a floating state;
 a keyboard on the top wall, opposite to the circuit board and the cooling fan;
 a first supporting member between the cooling fan and the keyboard and configured to support the keyboard when a key is depressed; and
 a second supporting member between the cooling fan and the bottom wall of the housing and configured to support the cooling fan when a key is depressed,
 at least one of the first and second supporting members comprises an elastic material.

2. The electronic apparatus of claim 1, wherein the first supporting member comprises a rib protruding from the cooling fan toward the keyboard.

3. The electronic apparatus of claim 2, wherein the second supporting member comprises an elastic material and attached to the cooling fan.

4. The electronic apparatus of claim 2, wherein the second supporting member comprises an elastic material and attached to the bottom wall of the housing.

5. The electronic apparatus of claim 1, wherein the first supporting member comprises a plurality of ribs protruding from the cooling fan toward the keyboard.

6. The electronic apparatus of claim 5, wherein the cooling fan comprises an arcuate side frame comprising a metal, an upper cover and a lower cover attached to the side frame and opposite to each other, a fan between the upper and lower covers, and the ribs and the side frame are combined.

7. The electronic apparatus of claim 6, wherein the cooler comprises a radiator plate and the side frame of the cooling fan combined and in contact with the electronic component and a heat pipe configured to conduct heat from the radiator plate to an air outlet side of cooling fan.

8. The electronic apparatus of claim 1, wherein the first supporting member comprises an elastic material and attached to one of the cooling fan and the keyboard.

9. An electronic apparatus of claim 8, wherein the second supporting member comprises a rib protruding from the cooling fan or the bottom wall of the housing.

10. An electronic apparatus comprising:
a housing;
a circuit board in the housing;
an electronic component is on the circuit board;
a radiator plate configured to be thermally connected to the electronic component;
a radiating member in the housing;
a heat pipe comprising a part fixed to the radiator plate and another part thermally connected to the radiating member at a position away from the radiator plate;
a cooling fan comprising an air intake and an air outlet in which the radiating member is provided, at least a part of the cooling fan being located between the electronic component and the radiating member, the cooling fan comprising an end portion supported by the radiator plate and another end portion formed with the air outlet; and
a second supporting member located between the cooling fan and an inner surface of the housing at around the intake and configured to suppress the inner surface to contact the cooling fan.

11. The electronic apparatus of claim 10, further comprising a first supporting member, and a keyboard on the housing, opposite to the circuit board and the cooling fan.

12. The electronic apparatus of claim 11, wherein a plural of the first supporting members are provided on the cooling fan along a peripheral edge of the intake.

13. The electronic apparatus of claim 11, wherein the first supporting member comprises a rib protruding from the cooling fan toward the keyboard and opposing the keyboard with a gap.

14. The electronic apparatus of claim 11, wherein the first supporting member comprises a plurality of ribs protruding from the cooling fan toward the keyboard and opposing the keyboard with a gap.

15. The electronic apparatus of claim 14, wherein the cooling fan comprises an arcuate side frame comprising a metal, an upper cover and a lower cover attached to the side frame and opposite to each other, a fan between the upper and lower covers, and the ribs and the side frame are combined.

16. The electronic apparatus of claim 11, wherein the first supporting member comprises an elastic material and attached to the cooling fan or the keyboard side.

17. The electronic apparatus of claim 10, wherein the second supporting member comprises an elastic material and attached to the cooling fan to oppose the inner surface of the housing with a gap.

18. The electronic apparatus of claim 10, wherein the second supporting member comprises an elastic material and attached to a bottom wall of the housing to oppose the cooling fan with a gap.

19. The electronic apparatus of claim 18, wherein the second supporting member comprises a rib projecting from the cooling fan or from the inner surface of the housing.

20. The electronic apparatus of claim 15, wherein the radiator plate and the side frame of the cooling fan are combined.

* * * * *